US012803543B2

(12) United States Patent
Pai

(10) Patent No.: US 12,803,543 B2
(45) Date of Patent: Nov. 17, 2026

(54) HIGH VOLTAGE AND HIGH CURRENT SUPER SWITCH

(71) Applicant: Halliburton Energy Services, Inc., Houston, TX (US)

(72) Inventor: Nagaraja K. Pai, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 334 days.

(21) Appl. No.: 18/402,718

(22) Filed: Jan. 2, 2024

(65) Prior Publication Data

US 2025/0219622 A1 Jul. 3, 2025

(51) Int. Cl.
*H03K 3/57* (2006.01)
*E21B 7/15* (2006.01)

(52) U.S. Cl.
CPC .................................... *H03K 3/57* (2013.01); *E21B 7/15* (2013.01)

(58) Field of Classification Search
CPC .. H03K 3/05; E21B 7/15; H10D 12/411–491; H10D 12/031–038; H10D 62/141–148; H10W 74/00–481
See application file for complete search history.

(56) References Cited

U.S. PATENT DOCUMENTS

| | | | | |
|---|---|---|---|---|
| 10,141,302 | B2 | 11/2018 | Das et al. | |
| 10,750,627 | B2 | 8/2020 | Cole et al. | |
| 10,896,809 | B2 | 1/2021 | Ziemba et al. | |
| 11,206,740 | B2 | 12/2021 | Cole et al. | |
| 2008/0237840 | A1 * | 10/2008 | Alcoe | H10W 40/22 257/706 |
| 2016/0204101 | A1 | 7/2016 | Das et al. | |
| 2017/0067292 | A1 | 3/2017 | Bayol et al. | |
| 2018/0313158 | A1 | 11/2018 | Gilbrech | |
| 2020/0053890 | A1 | 2/2020 | Cole et al. | |
| 2020/0161091 | A1 | 5/2020 | Ziemba et al. | |
| 2020/0359511 | A1 | 11/2020 | Cole et al. | |
| 2021/0360788 | A1 | 11/2021 | Kratzer et al. | |
| 2023/0326820 | A1 * | 10/2023 | Uhlig | H10W 74/47 257/14 |

FOREIGN PATENT DOCUMENTS

KR 10-2021-0070928 A 6/2021

OTHER PUBLICATIONS

International Search Report and Written Opinion for PCT/US2024/010460, mailed Sep. 30, 2024.

J. Biela et al., "Solid State Modulator for Plasma Channel Drilling," IEEE Transactions on Dielectrics and Electrical Insulation, vol. 16, No. 4, pp. 1093-1099, Aug. 28, 2009.

* cited by examiner

*Primary Examiner* — Shahed Ahmed
(74) *Attorney, Agent, or Firm* — DeLizio, Peacock, Lewin and Guerra, LLP

(57) ABSTRACT

A high-voltage and high-current pulse switching system is disclosed. The pulse switching system includes one or more pulse switching modules. Each pulse switching module includes a baseplate, an electrically non-conductive substrate, and a thermally conductive material applied between the baseplate and the substrate. The pulse switching module also includes semiconductor devices having wide band gap properties arranged in series with respect to one another on the substrate. The pulse switching module also includes an encapsulant material deposited over the semiconductor devices and the substrate.

21 Claims, 6 Drawing Sheets

HIGH VOLTAGE AND HIGH CURRENT SUPER SWITCH

TECHNICAL FIELD

The present disclosure generally relates to power management, and more specifically to a pulse switch that incorporates wide band gap devices.

BACKGROUND

A pulse power drill is used in a variety of settings, including downhole environments, in which the pulse power drill emits high-voltage bursts of electricity to pulverize portions of formation layers in the vicinity of one or more electrodes. In downhole environments, pulse power drills are subject to a combination of electrical, mechanical, and thermal conditions that may affect efficient operation. For instance, downhole environments typically entail high temperature ranges in which the pulse power drill operates, which can cause energy loss in certain components and overall performance of the drill.

BRIEF DESCRIPTION OF THE DRAWINGS

Illustrative embodiments of the present disclosure are described in detail below with reference to the attached drawing figures, which are incorporated by reference herein, and wherein.

Figure 1:
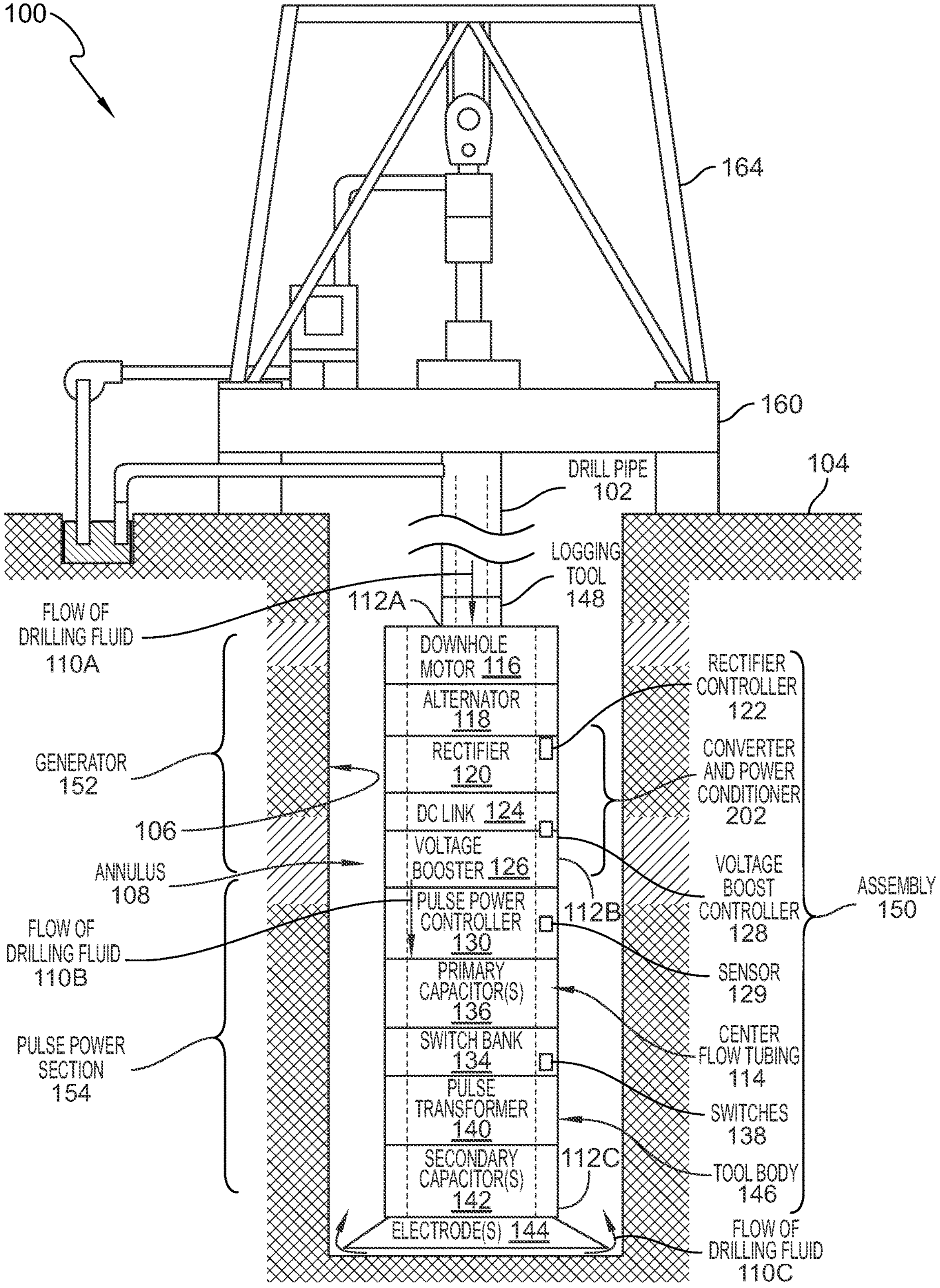
FIG. 1 illustrates a pulse power drilling system including a pulse power drilling assembly, according to an embodiment.

The illustrated figures are only exemplary and are not intended to assert or imply any limitation with regard to the environment, architecture, design, or process in which different embodiments may be implemented.

DETAILED DESCRIPTION

In the following detailed description of the illustrative embodiments, reference is made to the accompanying drawings that form a part hereof. These embodiments are described in sufficient detail to enable those skilled in the art to practice the invention, and it is understood that other embodiments may be utilized and that logical structural, mechanical, electrical, and chemical changes may be made without departing from the spirit or scope of the invention. To avoid detail not necessary to enable those skilled in the art to practice the embodiments described herein, the description may omit certain information known to those skilled in the art. The following detailed description is, therefore, not to be taken in a limiting sense, and the scope of the illustrative embodiments is defined only by the appended claims.

A pulse power drill is used in environments that are subject to a combination of electrical, mechanical, and thermal conditions. Consequently, components of the pulse power drill should be engineered to efficiently operate while taking into account such conditions. One of the main components of a pulse power drill is a power system that includes a pulse switch. The pulse switch is interconnected with other components within the system to initiate an energy pulse capable of crushing rock under significantly high voltage and electrical current levels delivered to one or more electrodes positioned at or near the bottom surface of a borehole. However, due to high temperatures associated with the environments, energy transmission losses, thermal losses, and grounding effects may occur, resulting in operational inefficiencies and reduced safety. Current compact solutions for switching devices and systems incorporate insulated gate thyristors that are incapable of operating efficiently past temperatures of, e.g., 80 degree Celsius.

Embodiments presented herein disclose a high current and high voltage pulse switching system operable in high temperature environments, such as downhole drilling environments. The pulse switching system of the present disclosure incorporates one or more semiconductor devices that have wide band gap properties to allow for increased performance and efficiency of switching modules within the system. For instance, pulse switching modules may include silicon carbide (SiC) metal-oxide-semicondutor field-effect transistors (MOSFETs), which are capable of a high critical electric field, wide band gap, and high temperature handling, compared to other semiconductors or diodes incorporating other types of material. Embodiments of the pulse switching modules also incorporate elements such as thermal interfacing material and heat absorption materials to efficiently manage heat transfer and losses at the pulse switching system during operation of the pulse power drill. Further embodiments of the pulse switching system include a heat-sink architecture to absorb heat losses, e.g., caused by fast energy pulses in the pulse power drill.

Further still, embodiments may include techniques for packaging multiple pulse switching modules in the system to achieve high pulse currents at high voltages. Particularly, as further described herein, embodiments include packaging pulse switching modules in a sandwich arrangement and stacking the modules in such a manner that the semiconductor devices of multiple pulse switching modules are connected in series.

Referring now to FIG. 1, a pulse power drilling system having a pulse power drilling assembly is shown. More particularly, FIG. 1 illustrates an example pulse power drilling apparatus 100. The example pulse power drilling apparatus 100 can include a pulse power drilling assembly (also referred to herein as "assembly") 150 positioned in a borehole 106 and secured to a length of drill pipe 102 coupled to a drilling platform 160 and a derrick 164. While depicted on the land 104 as an onshore drilling operation, example embodiments can also be performed as an offshore drilling operation. The assembly 150 can be configured to further the advancement of the borehole 106 using pulse electrical power generated by the assembly 150 and provided to electrodes 144 in a controlled manner to emit an electrical discharge through formation material of a subsurface formation along the bottom face of the borehole 106 and in nearby proximity to the electrodes 144.

Illustratively, the assembly 150 includes multiple sub-assemblies, including, in an embodiment, a downhole motor 116 at a top of the assembly 150, in which the top of the assembly is a face of the assembly 150 furthest from a drilling face of the assembly 150 (having the electrodes 144). The downhole motor 116 is coupled to multiple additional sub-sections or components. The downhole motor 116 can be any type of device or machine that converts hydraulic energy into mechanical energy from a flow of fluid (e.g., a "mud pit" located at the surface and in the vicinity of the borehole 106). Examples of such a downhole motor may include a turbine, a positive displacement motor (PDM), etc. These additional sub-sections or components may include various combinations of an alternator sub-section or component of the assembly (hereinafter "alternator") 118, a rectifier 120, a rectifier controller 122, a direct current (DC) link 124, a voltage booster (alternatively referred to as an output power converter) 126, a voltage boost controller 128, a pulse power controller 130, a switch bank 134 (including one or more switches 138), one or more primary capacitor(s) 136, a pulse transformer 140, one or more secondary capacitors 142, and the electrodes 144. While described as a voltage booster, other power converters may be used in place of voltage booster 126.

The assembly 150 can be divided into a generator 152 and a pulse power section 154. The generator 152 can include the downhole motor 116 and a converter and power conditioner. The converter and power conditioner can include an alternator 118, the rectifier 120, the rectifier controller 122, the DC link 124, the voltage booster 126, and the voltage boost controller 128. The pulse power section 154 can include the pulse power controller 130, the switch bank 134 (and switches 138), the one or more primary capacitors, the pulse transformer 140, the one or more secondary capacitors, and the electrodes 144. Components can be divided between the generator 152 and the pulse power section 154 in other arrangements, and the order of the components can be other than shown.

In some embodiments, the rectifier 120, the DC link 124, and the voltage booster 126 may be referred to as a "power conditioning system" (PCS) and are included in the converter and power conditioner 202. These additional subassemblies of the PCS may be electrically coupled to receive the electrical power output generated by the alternator 118 and to provide further processing of the received electrical power to provide a conditioned electrical power output comprising conditioned electrical power. This further processing of the electrical power output received at the PCS may include rectification, voltage boosting, and frequency and/or waveform smoothing or regulating of the received electrical power. In operation, the rectifier controller 122 may control rectification functions performed by the PCS, while the voltage boost controller 128 may control voltage boosting functions being performed by the PCS. In an embodiment, a single controller may control both the rectifier 120 and the voltage booster 126.

The assembly 150 may be comprised of multiple sub-sections, with a joint used to couple each of these sub-sections together in a desired arrangement to form the assembly 150. Field joints 112A-C can be used to couple the generator 152 and the pulse power section 154 to construct the assembly 150 and to couple the assembly 150 to the drill pipe 102. In an embodiment, the assembly 150 may include one or more additional field joints coupling various components of the assembly 150 together. Field joints may be places where the assembly 150 is assembled or disassembled in the field (e.g., at the drill site). In addition, the assembly 150 may require one or more joints referred to as shop joints that are configured to allow various sub-sections of the assembly 150 to be coupled together (e.g., at an assembly plant or at a factory). For example, various components of the assembly 150 may be provided by different manufacturers, or assembled at different locations, which require assembly before being shipped to the field.

Regardless of whether a joint in the assembly 150 is referred to as a field joint or a shop joint, the center flow tubing 114 extends through any of the components that include the center flow tubing 114. A joint between separate sections of the center flow tubing 114 or a hydraulic seal capable of sealing the flow of the drilling fluid within the center flow tubing 114 may be formed to prevent leaking at the joints.

A flow of drilling fluid (illustrated by the arrow 110A pointing downward within the drill pipe 102) can be provided from the drilling platform 160, and flow to and through the downhole motor 116, exiting the downhole motor 116 and flowing on into other sub-sections or components of the assembly 150, as indicated by the arrow 110B. For example, the downhole motor 116 can be a turbine such that the flow of drilling fluid through the device 116 can cause the downhole motor 116 to be mechanically rotated. This mechanical rotation can be coupled to the alternator 118 in order to generate electrical power. The PCS can further process and controllably provide the electrical power to the rest of the downstream assembly 150. The stored power can then be output from the electrodes 144 in order to perform the advancement of the borehole 106 via periodic electrical discharges.

The drilling fluid can flow through the assembly 150, as indicated by arrow 110B, and flow out and away from the electrodes 144 and back toward the surface to aid in the removal of the debris generated by the breaking up of the formation material at and nearby the electrodes 144. The fluid flow direction away from the electrodes 144 is indicated by arrows 110C and 110D. In addition, the flow of drilling fluid may provide cooling to one or more devices and to one or more portions of the assembly 150. In various embodiments, it is not necessary for the assembly 150 to be rotated as part of the drilling process, but some degree of rotation or oscillations of the assembly 150 may be provided in various embodiments of drilling processes utilizing the assembly 150, including internal rotations occurring at the downhole motor 116, in the alternator sub-section, etc.

The flow of drilling fluid passing through the downhole motor 116 can continue to flow through one or more sections of a center flow tubing 114, which thereby provides a flow path for the drilling fluid through one or more sub-sections or components of the assembly 150 positioned between the downhole motor 116 and the electrodes 144, as indicated by the arrow 110B pointing downward through the cavity of the sections of the center flow tubing 114. Once arriving at the electrodes 144, the flow of drilling fluid can be expelled out from one or more ports or nozzles located in or in proximity to the electrodes 144. After being expelled from the assembly 150, the drilling fluid can flow back upward toward the surface through an annulus 108 created between the assembly 150 and walls of the borehole 106.

The center flow tubing 114 may be located along a central longitudinal axis of the assembly 150 and may have an overall outside diameter or outer shaped surface that is smaller in cross-section than the inside surface of a tool body 146 in cross-section. As such, one or more spaces can be created between the center flow tubing 114 and an inside wall of the tool body 146. These one or more spaces may be used to house various components, such as components which make up the alternator 118, the rectifier 120, the rectifier controller 122, the DC link 124, the voltage booster 126, the voltage boost controller 128, the sensor 129, the pulse power controller 130, the switch bank 134, the one or more switches 138, the one or more primary capacitor(s) 136, the pulse transformer 140, and the one or more secondary capacitors 142, as shown in FIG. 1. The sensor 129 can be located in different locations within the assembly. As depicted in FIG. 1, the sensor 129 is positioned near the pulse power controller 130. However, the sensor 129 can be in any location within the assembly 150 and may include more than a single sensor (depending on the size and particular sensor measurement). Other components may be included in the spaces created between the center flow tubing 114 and the inside wall of the tool body 146.

The center flow tubing 114 can seal the flow of drilling fluid within the hollow passageways included within the center flow tubing 114 and at each joint coupling sections of the center flow tubing 114 together to prevent the drilling fluid from leaking into or otherwise gaining access to these spaces between the center flow tubing 114 and the inside wall of the tool body 146. Leakage of the drilling fluid outside the center flow tubing 114 and within the assembly 150 may cause damage to the electrical components or other devices located in these spaces and/or may contaminate fluids, such as lubrication oils, contained within these spaces, which may impair or completely impede the operation of the assembly 150 with respect to drilling operations.

The example pulse power drilling apparatus 100 can include one or more logging tools 148. The logging tools 148 are shown as being located on the drill pipe 102, above the assembly 150, but can also be included within the assembly 150 or joined via shop joint or field joint to assembly 150. The logging tools 148 can include one or more logging with drilling (LWD) or measurement while drilling (MWD) tool, including resistivity, gamma-ray, nuclear magnetic resonance (NMR), etc. The logging tools 148 can include one or more sensors to collect data downhole. For example, the logging tools 148 can include pressure sensors, flowmeters, etc. The example pulse power drilling apparatus 100 can also include directional control, such as for geosteering or directional drilling, which can be part of the assembly 150, the logging tools 148, or located elsewhere on the drill pipe 102.

Communication from the pulse power controller 130 to the voltage boost controller 128 allows the pulse power controller 130 to transmit data about and modifications for pulse power drilling to the generator 152. Similar, communication from the voltage boost controller 128 to the pulse power controller 130 allows the generator 152 to transmit data about and modifications for pulse power drilling to the pulse power section 154. The pulse power controller 130 can control the discharge of the pulse power stored for emissions out from the electrodes 144 and into the formation, into drilling mud, or into a combination of formation and drilling fluids. The pulse power controller 130 can measure data about the electrical characteristics of each of the electrical discharges-such as power, current, and voltage emitted by the electrodes 144. Based on information measured for each discharge, the pulse power controller 130 can determine information about drilling and about the electrodes 144, including whether or not the electrodes 144 are firing into the formation (i.e., drilling) or firing into the formation fluid (i.e., electrodes 144 are off bottom). The generator 152 can control the charge rate and charge voltage for each of the multiple pulse power electrical discharges. The PCS, together with the downhole motor 116 and alternator 118, can create an electrical charge in the range of 16 kilovolts (kV) which the pulse power controller 130 delivers to the formation via the electrodes 144.

When the pulse power controller 130 can communicate with the generator 152, the generator 152 and the alternator 118 can ramp up and ramp down in response to changes or electrical discharge characteristics detected at the pulse power controller 130. Because the load on the downhole motor 116, the alternator 118, and the generator 152 is large (due to the high voltage), ramping up and ramping down in response to the needs of the pulse power controller 130 can protect the generator 152 and associated components from load stress and can extend the lifetime of components of the pulse power drilling assembly. If the pulse power controller 130 cannot communicate with the generator 152, then the generator 152 may apply a constant charge rate and charge voltage to the electrodes 144 or otherwise respond slowly to downhole changes-which would be the case if the generator 152 is controlled by the drilling mud flow rate adjusted at the surface or another surface control mechanism.

In instances where the assembly 150 is off bottom, electrical power input to the system can be absorbed (at least partially) by drilling fluid, which can be vaporized, boiled off, or destroyed because of the large power load transmitted in the electrical pulses. In instances where the assembly 150 is not operating correctly, such as when one or more switch experiences a fault or requires a reset, application of high power to the primary and/or secondary capacitors 136/142 or the electrodes 144 can damage circuitry and switches when applied at unexpected or incorrect times. In these and additional cases, communications or messages between the pulse power controller 130 and the generator 152 allow the entire assembly to vary charge rates and voltages, along with other adjustments further discussed below. In cases where the pulse power controller 130 and generator 152 are autonomous, i.e., not readily in communication with the surface, downhole control of the assembly 150 can improve pulse power drilling function.

In an embodiment, generated DC electrical power is stored in the primary capacitors 136 and secondary capacitors 142. The power can continue to be generated based on the flow of drilling even after the primary capacitors 136 (secondary capacitors 142) are fully charged. Switches 138 may be configured to control the charging and/or discharging of the primary capacitors 136. Switches 138 may also be configured to controllably couple electrical power stored in primary capacitors 136 to the primary winding(s) of the transformer 140. In an embodiment, switches 138 can be opened to prevent additional storage of energy in the primary capacitors 136 until the energy is discharged therefrom to generate a pulse of electrical discharge emitted into the subsurface formation. The switch 138 can then be closed again to allow for storage of energy in the primary capacitors 138. In some embodiments, while the switch is open and the power continues to be generated based on the flow of the drilling, the generated power can be stored in different capacitors (e.g., capacitors in the generator 152) until the switch 138 is again closed.

Figure 2:
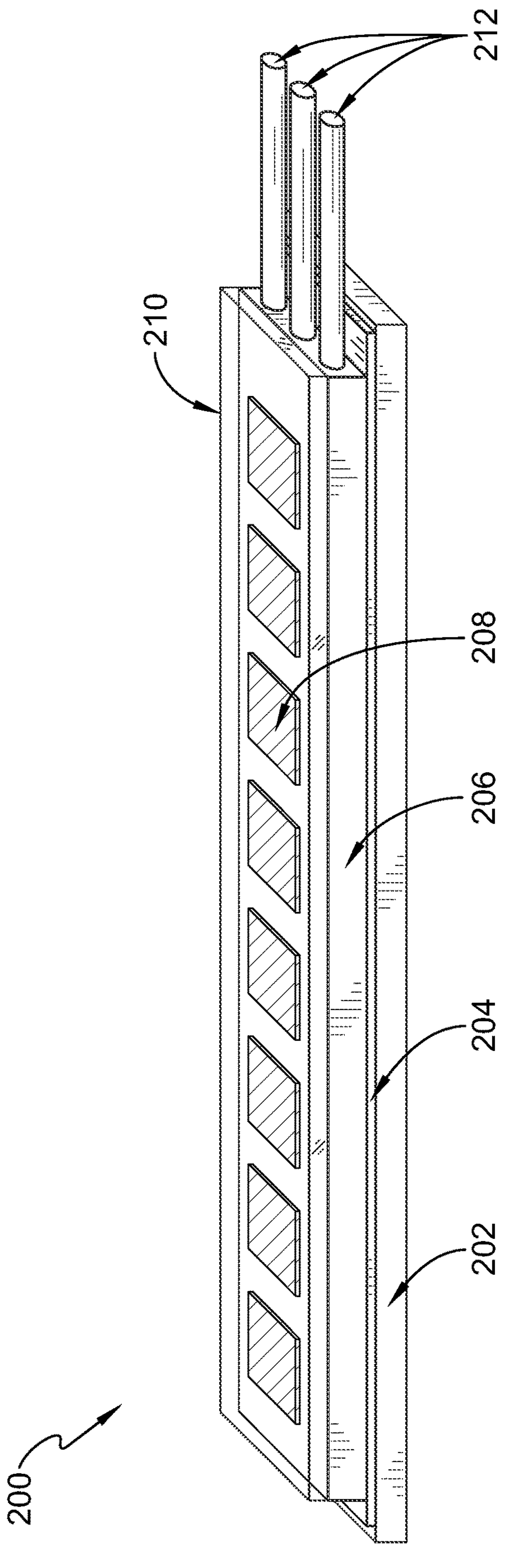
FIG. 2 illustrates a perspective view of an example pulse switching module of the pulse power drilling system of FIG. 1, according to an embodiment.

A switch 138 may comprise one or more pulse switching modules. Referring now to FIG. 2, an example embodiment of a pulse switching module 200 of a pulse switching system is shown. The illustrative pulse switching module 200 includes components that provide for a high thermal capacity, low thermal resistance, efficient heat removal, and high voltage insulation while providing fast currents and switching rates. As shown, the pulse switching module 200 includes a baseplate 202, thermal interfacing material 204, substrate 206, one or more semiconductor devices 208, an encapsulant material 210, and one or more heat pipes 212.

The baseplate 202 may be comprised of any material on which other components of the pulse switching module 200 may be mounted, bonded, or otherwise assembled. The baseplate 202 may further be any material to provide mechanical support and voltage and thermal protection for the components of the pulse switching module 200. A thermal interfacing material 204 may be applied to the baseplate 202 to couple baseplate 202 with the substrate 206. In an embodiment, the thermal interfacing material 204 is a thermally conductive material such as a boron nitride (BN)-based epoxy, silicone gel, or any thermally conductive epoxy having a sufficient amount of metallic properties to provide a thermal connection between the substrate 206 and the baseplate 202.

In an embodiment, the substrate 206 is a thermally conductive, electrically non-conductive insulating layer of material attached to the baseplate 202. For example, the substrate 206 may be a ceramic material that has such properties. For instance, the substrate 206 may be formed of an aluminum nitride material, aluminum oxide material, gallium nitride material, and so on.

The illustrative one or more semiconductor devices 208 may be embodied as any semiconductor, transistor, and/or diode that has wide band gap and high critical field properties. For example, the one or more semiconductor devices 208 may comprise SiC MOSFETs, which perform well in high temperature environments (such as in downhole drilling environments in wellbores) and in high switching frequency applications. SiC MOSFETS also perform well in high-power density applications, such as in power conditioning. Other advantageous properties include high breakdown voltage and low power loss. Of course, the one or more semiconductor devices 208 may be embodied as other types of diodes, transistors, Junction field-effect transistors (JFETs), gate turn-off thyristors (GTOs), thyristors, etc. For instance, the one or more semiconductor devices 208 may include silicon (Si)-based FETs and diodes, SiC-based insulated gate bipolar transistors (IGBTs), gallium arsenide-based semiconductors, gallium nitride-based semiconductors, and so on.

Illustratively, eight semiconductor devices 208 are arranged in series with respect to one another. However, one of skill in the art will recognize that, in practice, the amount of semiconductor devices 208 in each pulse switching module 200 may vary based on a variety of factors. For example, the amount of semiconductor devices 208 for a given pulse switching module 200 may be dependent on the overall voltage and voltage requirements of a stack of the pulse switching modules 200 in the assembly 150. Further still, although the illustrative pulse switching module 200 depicts a single row lining the one or more semiconductor devices 208 along the substrate 206, the one or more semiconductor devices 208 may be provided in a multiple row arrangement on the substrate 206.

In an embodiment, an encapsulant material 210 may be deposited over the substrate 206 and semiconductor devices 208 to provide high voltage protection and protection against partial discharge for the pulse switching module 200, in which the pulse switching module 200 is capable of achieving over a 10 kilovolt (kV) rating. The encapsulant material 210 may be embodied as a silicone encapsulant. In an embodiment, a coating may be applied to the encapsulant material 210 to further decrease partial electrical discharge in operation of the pulse switching module 200.

In an embodiment, the one or more heat pipes 212 may be embedded within the substrate 206 to rapidly transfer heat away from the one or more semiconductor devices 208 in operation. The one or more heat pipes 212 may be formed of any material such as copper. Of course, the one or more heat pipes 212 do not necessarily have to be positioned within the substrate 206. For instance, other embodiments may embed the one or more heat pipes 212 within the baseplate 202. In addition, yet other embodiments may omit the one or more heat pipes 212 as being part of the pulse switching module 200 altogether. In such an embodiment, the pulse switching module 200 (or pulse switching system) may incorporate a cooling mechanism such as forced air or forced liquid cooling architectures.

Figure 3:
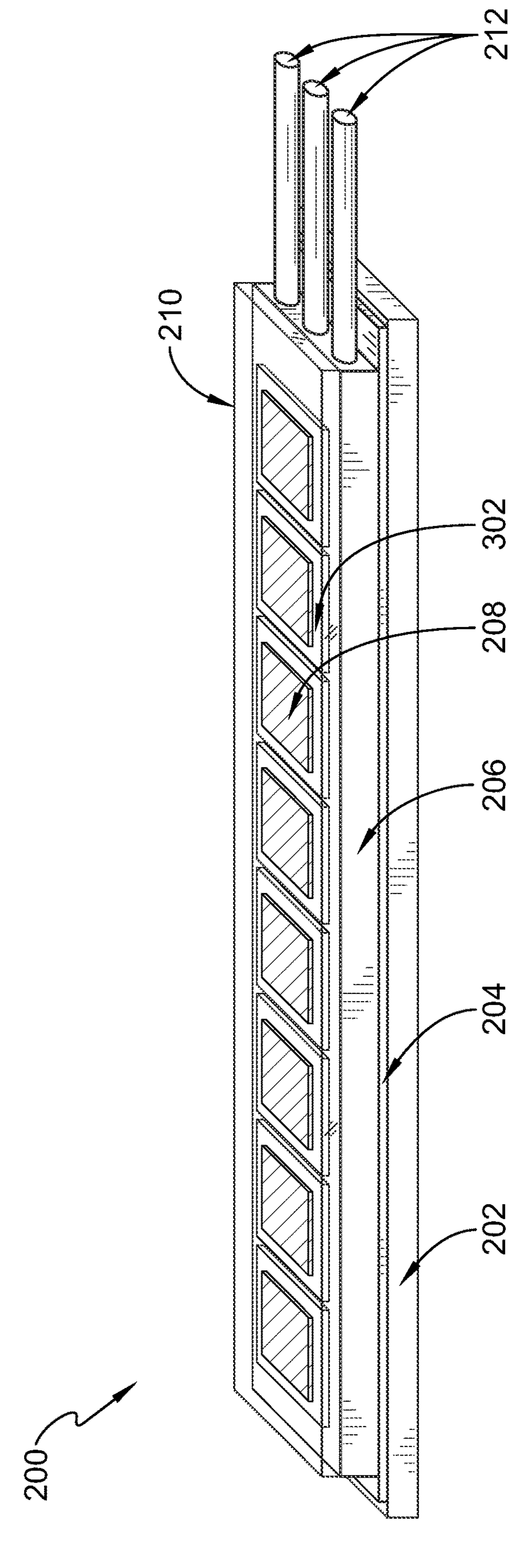
FIG. 3 illustrates a perspective view of an example pulse switching module of the pulse power drilling system of FIG. 1 in which phase changing inserts are incorporated therein, according to an embodiment.

Because the semiconductor devices 208 serve as a source of heat during operation of the pulse switching module 200, it may be advantageous to include components to provide additional thermal capacity in the pulse switching module 200. Referring now to FIG. 3, the pulse switching module 200 is shown including the previously described components of the baseplate 202, thermal interfacing material 204, substrate 206, one or more semiconductor devices 208, encapsulant material 210, and heat pipes 212. In an embodiment, a metal insert 302 may be positioned between the substrate 206 and a respective semiconductor device 208. Illustratively, a metal insert 302 is positioned between each of a respective semiconductor device 208 and the substrate 206. The metal inserts 302 may be embodied as plate inserts having phase changing properties at a given temperature, such as around approximately 200 degrees Celsius, to provide additional thermal capacity and absorption, e.g., to efficiently and relatively quickly absorb transient energy losses during pulses without any substantial increase in temperature to the pulse switching module 200. The metal inserts 302 may then transfer the losses to the substrate 206 in between the pulses.

Figure 4A:
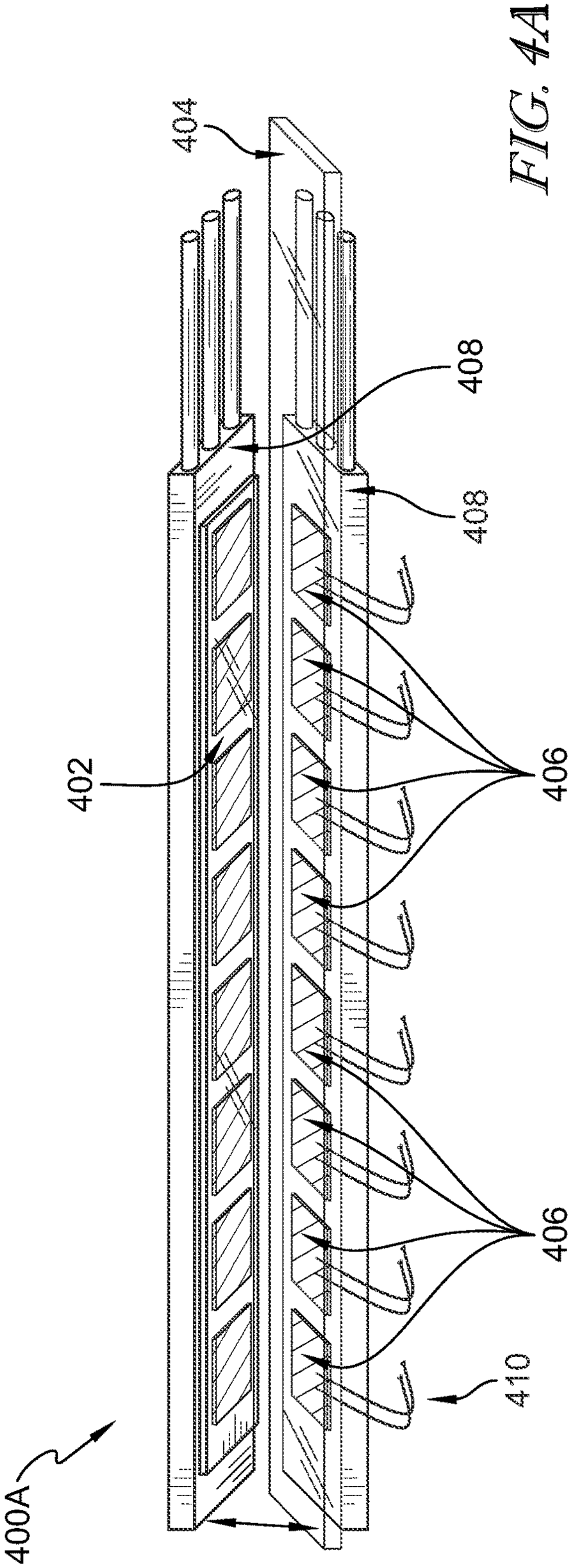
FIGS. 4A and 4B illustrate conceptual diagrams of a sandwiched substrate construction of pulse switching modules of the pulse power drilling system of FIG. 1, according to an embodiment.
Figure 4B:
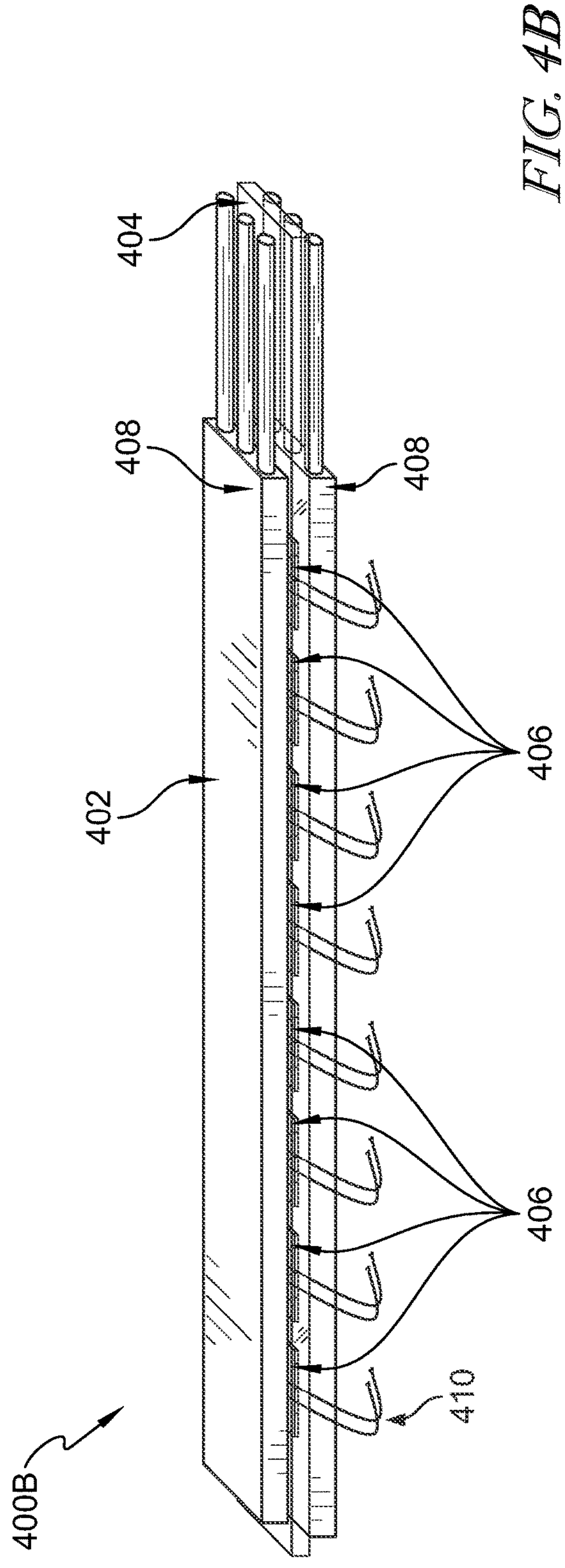

In an embodiment, multiple pulse switching modules 200 may be stacked to achieve high pulse current and switching. Referring now to FIGS. 4A and 4B, an example sandwich packaging scheme for a pulse switching module 200 is shown. Portion 400A shows a partially exploded view of a top contact plate 402 (top section) and a pulse switching module 200 (bottom section). The pulse switching module 200 shares similar or identical features of the pulse switching module 200 shown in FIGS. 2 and 3. For instance, FIG. 4A depicts a substrate and heat pipe arrangement 408 (formed of similar or identical materials to the substrate 206 and one or more heat pipes 212 described herein) as well as one or more semiconductor devices 406 (which are similar or identical to the one or more semiconductor devices 208 described herein). Illustratively, control wires 410 protrude from each of the one or more semiconductor devices 406 and electrically couple the pulse switching module 200 to a controller device (not shown).

The top contact plate 402 may also comprise a substrate and heat pipe arrangement 408 (formed of similar or identical materials to the substrate 206 and one or more heat pipes 212 described herein). Illustratively, one or more phase changing metal inserts are arranged along the top contact plate 402 substrate to align, in parallel, with each respective one or more semiconductor devices 406. Such an arrangement allows the phase changing metal inserts on the top section and the phase changing metal inserts on bottom section to absorb heat from both sides of the one or more semiconductor devices 406. Portion 400B shows the sandwich assembly. An encapsulant material 404 (similar or identical to the encapsulant material 210 described herein)

may be deposited between the top section and the bottom section to adhere each section to one another and provide a protective layer.

Figure 5:
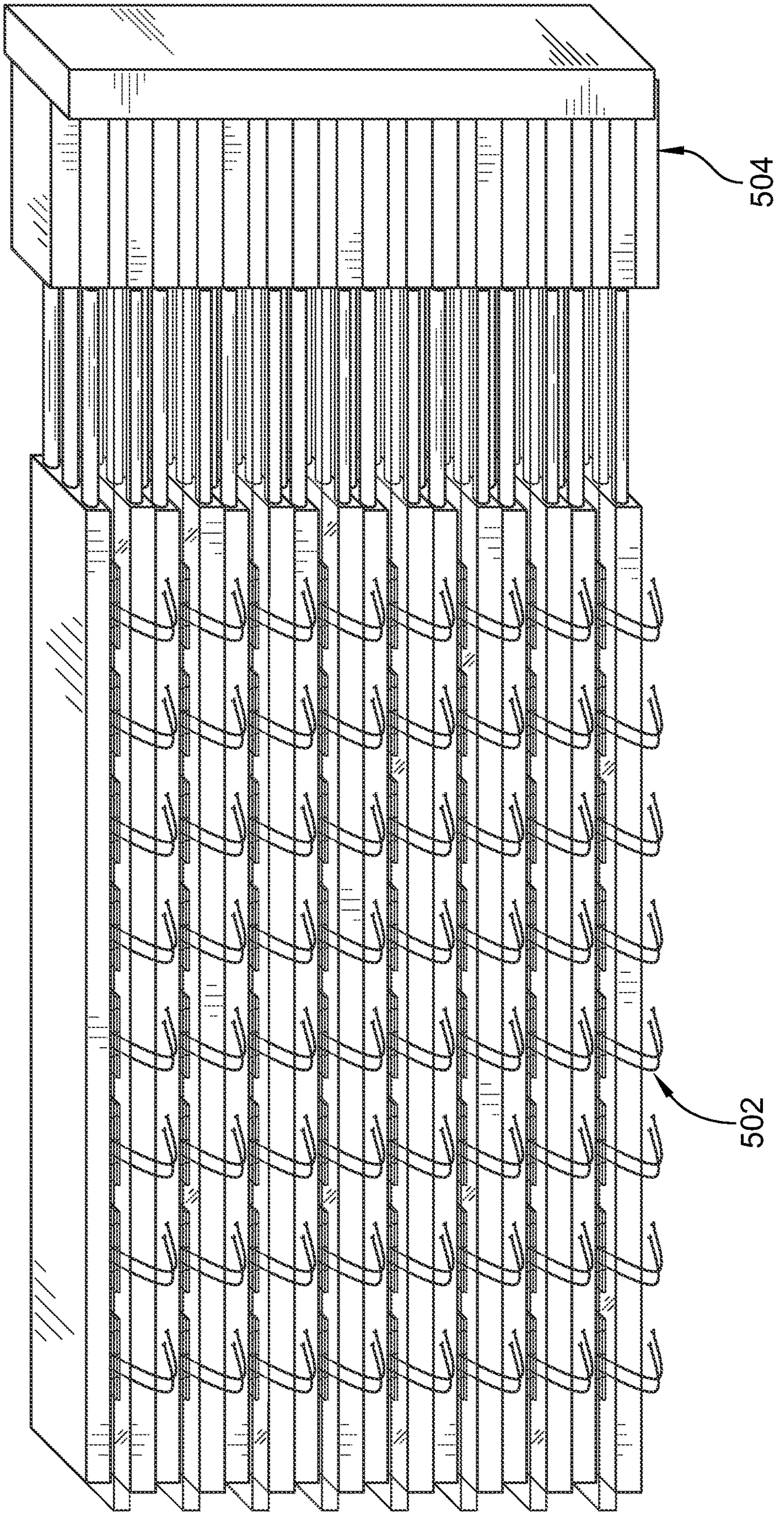
FIG. 5 illustrates a pulse switching system of the pulse power drilling system, according to an embodiment.

In an embodiment, the pulse switching modules 200, in the sandwich assembly arrangement, may be stacked and coupled with one another such that semiconductor devices of a given pulse switching module are connected in a parallel configuration. Referring now to FIG. 5, an example stacking arrangement in which multiple pulse switching modules 200 (in the sandwich assembly arrangement) are stacked and interconnected using control wires 502 connecting to a controller (not shown). Further, the stacking arrangement allows for the drain, source, and gate terminals of a given semiconductor device to connected with the respective drain, source, and gate terminals of the parallel semiconductor device. Such a configuration allows the pulse switching modules 200 to scale and achieve high pulse currents. Under a configuration, the pulse switching modules 500 are also, e.g., able to achieve switching currents from 5 kA to 50 kA, switching voltages from 10 kV to 150 kV, switching pulse widths from 5 microseconds to 10 microseconds, etc.

Illustratively, the stacking arrangement of pulse switching modules 200 may couple, via the lower temperature ends of the heat pipes protruding therefrom, to a heat exchange assembly 504. The heat exchange assembly 504 may be a block apparatus creating a heat exchange loop with the heat pipes, such that the heat exchange assembly 504 receives heat transferred from the pipes and flows cooler fluid through the heat pipe and into the substrate.

Although FIG. 5 depicts a stacked assembly of a single row of semiconductor devices arranged in parallel, other embodiments may contemplate multiple stacked assemblies in which the semiconductors are also arranged in multiple rows, creating three-dimensional pulse power switching system of semiconductor devices. The heat exchange assembly 504 provided herein prevents heat from being trapped in such a configuration. Thus, in operation, the overall temperature of the stacked assembly may build up within several seconds (as the semiconductor devices heat up) but reach an ambient average temperature as the heat exchange assembly 504 absorbs the heat.

Figure 6:
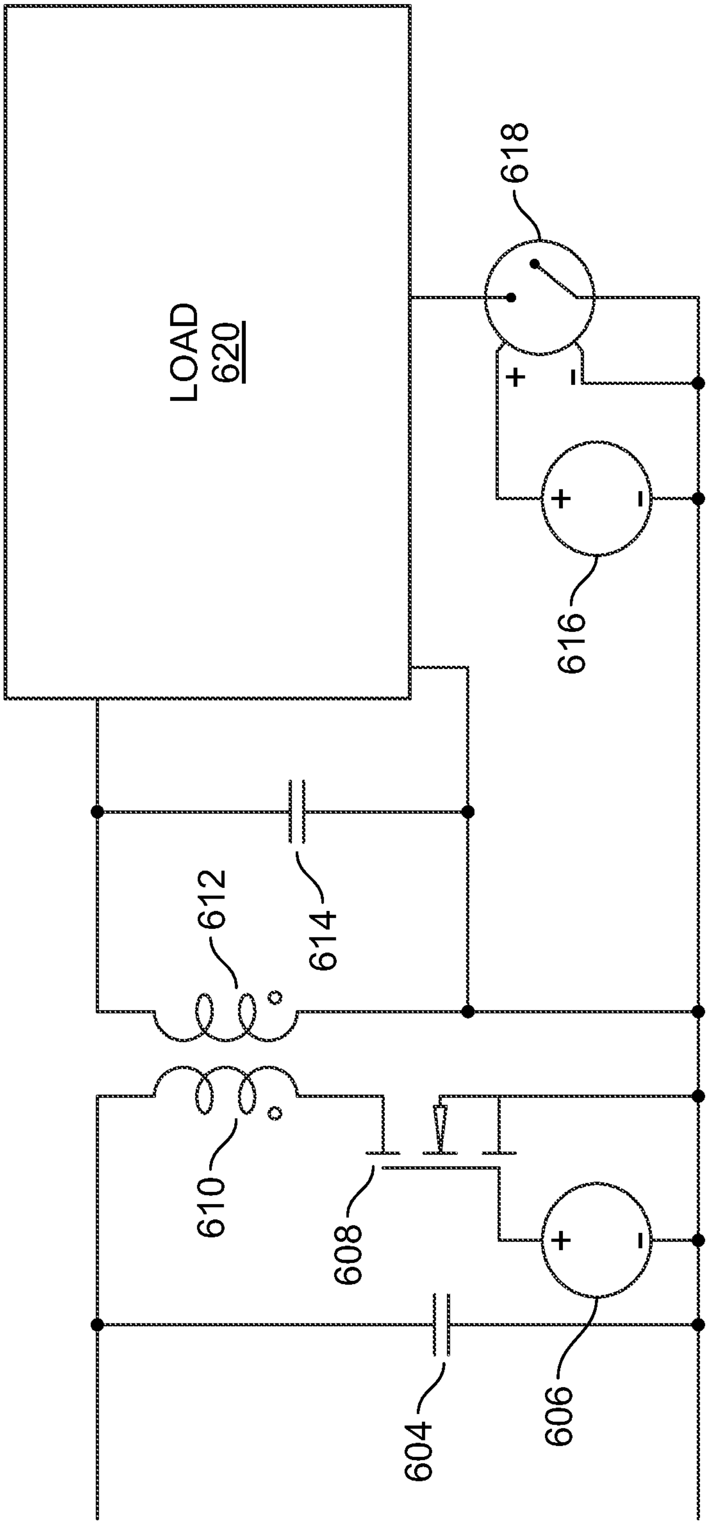
FIG. 6 is a schematic diagram of a pulse power scheme in the pulse power drilling system of FIG. 1, according to an embodiment.

Referring now to FIG. 6, a pulsed power scheme in which the pulse switching system 608 operates is shown. More particularly, a schematic diagram depicting a pulsed power scheme of the pulse power drilling assembly 150 (e.g., via a controller) delivering electricity to a load 620 for an example drilling application (e.g., pulsing electrical discharge into a rock of a formation). In the pulsed power scheme, an energy pulse can be generated by connecting a charged capacitor 604 across inductors 610 and 612 (which is a primary winding of a transformer, forming the first resonant scheme). A drain contact of the pulse switching system 608 is coupled with a DC voltage source 606.

The energy pulse is transferred to the second resonant scheme in the secondary transformer. The load 620 is coupled with an output switch module 618, which itself is electrically coupled with a DC voltage source 616. Note, although the FIG. 6 depicts the pulse power scheme as including a transformer, in other embodiments, the pulse switching system 608 may perform switching such that power is transferred directly to the load 620 (e.g., without involving a transformer). In other embodiments, the load 620 may comprise the transformer of the pulse power drilling assembly 150.

The above-disclosed embodiments have been presented for purposes of illustration and to enable one of ordinary skill in the art to practice the disclosure, but the disclosure is not intended to be exhaustive or limited to the forms disclosed. Many insubstantial modifications and variations will be apparent to those of ordinary skill in the art without departing from the scope and spirit of the disclosure. For instance, although the flowcharts depict a serial process, some of the steps/processes may be performed in parallel or out of sequence, or combined into a single step/process. The scope of the claims is intended to broadly cover the disclosed embodiments and any such modification. Further, the following clauses represent additional embodiments of the disclosure and should be considered within the scope of the disclosure.

Clause 1 includes a pulse switching module, comprising a baseplate; an electrically non-conductive substrate; a thermally conductive material applied between the baseplate and the substrate; a plurality of semiconductor devices arranged in series with respect to one another on the substrate, the plurality of semiconductor devices having wide band gap properties; and an encapsulant material deposited over the plurality of semiconductor devices and the substrate.

Clause 2 includes the subject matter of Clause 1, and further including a plurality of metal inserts, each metal insert positioned between a respective one of the plurality of semiconductor devices and the substrate, the metal insert having phase changing properties.

Clause 3 includes the subject matter of any of Clauses 1 and 2, and further including one or heat pipes embedded within the electrically non-conductive substrate.

Clause 4 includes the subject matter of any of Clauses 1-3, and wherein each semiconductor device comprises one of a wide bandgap MOSFET, JFET, GTO, IGBT, or thyristor.

Clause 5 includes the subject matter of any of Clauses 1-4, and wherein each semiconductor device comprises a wide bandgap diode.

Clause 6 includes the subject matter of any of Clauses 1-5, and wherein the encapsulant material comprises a silicone encapsulant.

Clause 7 includes the subject matter of any of Clauses 1-6, and further including one or more control wires electrically coupling the pulse switching module with a controller.

Clause 8 includes a pulse switching system, comprising one or more pulse switching modules, each pulse switching module comprising a baseplate; an electrically non-conductive substrate; a thermally conductive material applied between the baseplate and the substrate; a plurality of semiconductor devices arranged in series with respect to one another on the substrate, the plurality of semiconductor devices having wide band gap properties; and an encapsulant material deposited over the plurality of semiconductor devices and the substrate.

Clause 9 includes the subject matter of Clause 8, and wherein each pulse switching module further comprises a plurality of metal inserts, each metal insert positioned between a respective one of the plurality of semiconductor devices and the substrate, the metal insert having phase changing properties.

Clause 10 includes the subject matter of any of Clauses 8 and 9, and wherein each pulse switching module further comprises one or heat pipes embedded within the electrically non-conductive substrate.

Clause 11 includes the subject matter of any of Clauses 8-10, and further including a heat exchange assembly coupled with the one or more heat pipes.

Clause 12 includes the subject matter of any of Clauses 8-11, and wherein each semiconductor device comprises one of a wide bandgap diode, MOSFET, JFET, GTO, IGBT, or thyristor.

Clause 13 includes the subject matter of any of Clauses 8-12, and wherein the encapsulant material comprises a silicone encapsulant.

Clause 14 includes the subject matter of any of Clauses 8-13, and further including one or more control wires electrically coupling the pulse switching modules with one another and with a controller.

Clause 15 includes the subject matter of any of Clauses 8-14, and wherein the plurality of semiconductor devices of a first one of the one or more pulse switching modules are further arranged in parallel with respect to a second one of the one or more pulse switching modules.

Clause 16 includes a pulse power drilling assembly, comprising a controller; one or more primary capacitors; a pulse transformer; and a pulse switching system comprising one or more pulse switching modules, each pulse switching module comprising a baseplate; an electrically non-conductive substrate; a thermally conductive material applied between the baseplate and the substrate; a plurality of semiconductor devices arranged in series with respect to one another on the substrate, the plurality of semiconductor devices having wide band gap properties; and an encapsulant material deposited over the plurality of semiconductor devices and the substrate.

Clause 17 includes the subject matter of Clause 16, and wherein each pulse switching module further comprises a plurality of metal inserts, each metal insert positioned between a respective one of the plurality of semiconductor devices and the substrate, the metal insert having phase changing properties.

Clause 18 includes the subject matter of any of Clauses 16 and 17, and wherein each pulse switching module further comprises one or heat pipes embedded within the electrically non-conductive substrate.

Clause 19 includes the subject matter of any of Clauses 16-18, and further including a heat exchange assembly coupled with the one or more heat pipes.

Clause 20 includes the subject matter of any of Clauses 16-19, and wherein each semiconductor device comprises one of a wide bandgap diode, MOSFET, JFET, GTO, IGBT, or thyristor.

As used herein, the singular forms "a," "an," and "the" are intended to include the plural forms as well, unless the context clearly indicates otherwise. It will be further understood that the terms "comprise" and/or "comprising," when used in this specification and/or in the claims, specify the presence of stated features, steps, operations, elements, and/or components, but do not preclude the presence or addition of one or more other features, steps, operations, elements, components, and/or groups thereof. In addition, the steps and components described in the above embodiments and figures are merely illustrative and do not imply that any particular step or component is a requirement of a claimed embodiment.

What is claimed is:

1. A pulse switching module, comprising:

a baseplate;

an electrically non-conductive substrate;

a thermally conductive material applied between the baseplate and the substrate;

a plurality of semiconductor devices arranged in series with respect to one another on the substrate, the plurality of semiconductor devices having wide band gap properties;

an encapsulant material deposited over the plurality of semiconductor devices and the substrate; and a plurality of metal inserts, each metal insert positioned between a respective one of the plurality of semiconductor devices and the substrate, the metal insert having phase changing properties.

2. The pulse switching module of claim 1, further comprising one or heat pipes embedded within the electrically non-conductive substrate.

3. The pulse switching module of claim 1, wherein each semiconductor device comprises one of a wide bandgap MOSFET, JFET, GTO, IGBT, thyristor, or a combination thereof.

4. The pulse switching module of claim 1, wherein each semiconductor device comprises a wide bandgap diode.

5. The pulse switching module of claim 1, wherein the encapsulant material comprises a silicone encapsulant.

6. The pulse switching module of claim 1, further comprising one or more control wires electrically coupling the pulse switching module with a controller.

7. A pulse switching system, comprising:

one or more pulse switching modules, each pulse switching module comprising:

a baseplate;

an electrically non-conductive substrate;

a thermally conductive material applied between the baseplate and the substrate;

a plurality of semiconductor devices arranged in series with respect to one another on the substrate, the plurality of semiconductor devices having wide band gap properties;

an encapsulant material deposited over the plurality of semiconductor devices and the substrate; and a plurality of metal inserts, each metal insert positioned between a respective one of the plurality of semiconductor devices and the substrate, the metal insert having phase changing properties.

8. The pulse switching system of claim 7, wherein each pulse switching module further comprises one or heat pipes embedded within the electrically non-conductive substrate.

9. The pulse switching system of claim 8, further comprising a heat exchange assembly coupled with the one or more heat pipes.

10. The pulse switching system of claim 7, wherein each semiconductor device comprises one of a wide bandgap diode, MOSFET, JFET, GTO, IGBT, thyristor, or a combination thereof.

11. The pulse switching system of claim 7, wherein the encapsulant material comprises a silicone encapsulant.

12. The pulse switching system of claim 7, further comprising one or more control wires electrically coupling the pulse switching modules with one another and with a controller.

13. The pulse switching module of claim 7, wherein the plurality of semiconductor devices of a first one of the one or more pulse switching modules are further arranged in parallel with respect to a second one of the one or more pulse switching modules.

14. A pulse power drilling assembly, comprising:

a controller;

one or more primary capacitors;

a pulse transformer; and a pulse switching system comprising one or more pulse switching modules, each pulse switching module comprising:

a baseplate;

an electrically non-conductive substrate;

a thermally conductive material applied between the baseplate and the substrate;

a plurality of semiconductor devices arranged in series with respect to one another on the substrate, the plurality of semiconductor devices having wide band gap properties; and an encapsulant material deposited over the plurality of semiconductor devices and the substrate.

15. The pulse power drilling assembly of claim 14, wherein each pulse switching module further comprises a plurality of metal inserts, each metal insert positioned between a respective one of the plurality of semiconductor devices and the substrate, the metal insert having phase changing properties.

16. The pulse power drilling assembly of claim 14, wherein each pulse switching module further comprises one or heat pipes embedded within the electrically non-conductive substrate.

17. The pulse power drilling assembly of claim 16, further comprising a heat exchange assembly coupled with the one or more heat pipes.

18. The pulse power drilling assembly of claim 14, wherein each semiconductor device comprises one of a wide bandgap diode, MOSFET, JFET, GTO, IGBT, thyristor, or a combination thereof.

19. A pulse switching module, comprising:

a baseplate;

an electrically non-conductive substrate;

a thermally conductive material applied between the baseplate and the substrate;

a plurality of semiconductor devices arranged in series with respect to one another on the substrate, the plurality of semiconductor devices having wide band gap properties;

an encapsulant material deposited over the plurality of semiconductor devices and the substrate; and one or heat pipes embedded within the electrically non-conductive substrate.

20. A pulse switching system, comprising:

one or more pulse switching modules, each pulse switching module comprising:

a baseplate;

an electrically non-conductive substrate;

a thermally conductive material applied between the baseplate and the substrate;

a plurality of semiconductor devices arranged in series with respect to one another on the substrate, the plurality of semiconductor devices having wide band gap properties;

an encapsulant material deposited over the plurality of semiconductor devices and the substrate; and one or heat pipes embedded within the electrically non-conductive substrate.

21. The pulse switching system of claim 20, further comprising a heat exchange assembly coupled with the one or more heat pipes.

* * * * *